United States Patent [19]
Choi

[11] Patent Number: 5,637,533
[45] Date of Patent: Jun. 10, 1997

[54] METHOD FOR FABRICATING A DIFFUSION BARRIER METAL LAYER IN A SEMICONDUCTOR DEVICE

[75] Inventor: Kyeong K. Choi, Ichonshi, Rep. of Korea

[73] Assignee: Hyundai Electronics Industries Co., Ltd., Rep. of Korea

[21] Appl. No.: 648,285

[22] Filed: May 15, 1996

[30] Foreign Application Priority Data

May 17, 1995 [KR] Rep. of Korea ............ 199-12306

[51] Int. Cl.⁶ .................... H01L 21/44; H01L 21/443
[52] U.S. Cl. ............................... 438/643; 438/653
[58] Field of Search ................... 437/190, 242; 156/659.11

[56] References Cited

U.S. PATENT DOCUMENTS 5,183,775  2/1993  Levy ............................. 437/24
5,555,486  9/1996  Kingon et al. ................. 257/306

*Primary Examiner*—John Niebling
*Assistant Examiner*—Kevin Turner
*Attorney, Agent, or Firm*—Blakely Sokoloff Taylor & Zafman

[57] ABSTRACT

A method for fabricating a diffusion barrier metal layer of a semiconductor device for preventing a material of a metal wiring of said semiconductor device from being diffused into a silicon layer under said metal wiring is disclosed including the steps of: exposing the surface of said silicon layer to oxygen plasma, to prevent a silicide from being formed at the interface between said silicon layer and diffusion barrier metal layer; forming a first diffusion barrier metal layer on said silicon layer; implanting oxygen ions into said first diffusion barrier metal layer; and forming a second diffusion barrier metal layer on said first diffusion barrier metal layer.

8 Claims, 3 Drawing Sheets

METHOD FOR FABRICATING A DIFFUSION BARRIER METAL LAYER IN A SEMICONDUCTOR DEVICE

BACKGROUND OF THE INVENTION

The present invention relates to a method for fabricating a diffusion barrier metal layer in a semiconductor device capable of preventing the substance of a metal wiring from being diffused into its underlayer during the formation of the metal wiring of the semiconductor device, and more particularly, to a method for fabricating a diffusion barrier metal layer which can be used in a deep and narrow contact.

Generally, a ruthenium oxide layer ($RuO_2$) is used as a diffusion barrier metal layer in a highly integrated semiconductor device above 256M DRAM, and used as a glue layer of a metal wiring formed of aluminum, tungsten, or copper. In prior arts, the ruthenium oxide layer is formed by the physical vapor deposition (PVD) or the chemical vapor deposition (CVD) method. In case of the PVD method, ruthenium and oxygen are compounded to form the ruthenium oxide layer. In case of the CVD method, ruthenium source gas and oxygen are compounded to form the ruthenium oxide layer through the metal organic chemical vapor deposition (MOCVD) method.

However, in case where the ruthenium oxide layer is formed by the CVD method, impurities are introduced into the ruthenium oxide layer. This increases the resistance value of the layer. In case that PVD is used, the step coverage of the ruthenium oxide layer is poor, and a silicide layer may be formed by the reaction of the ruthenium oxide layer and silicon. Furthermore, during the deposition of the ruthenium oxide layer, the oxidation rate is too low to form a stable ruthenium oxide layer.

SUMMARY OF THE INVENTION

It is an object of the present invention to provide a method for fabricating a diffusion barrier metal layer in a semiconductor device, capable of preventing a silicide layer from being formed at the interface between of ruthenium and silicon layer, and forming a stable ruthenium oxide layer at a high temperature.

To accomplish the object of the present invention, there is provided a method for fabricating a diffusion barrier metal layer in a semiconductor device for preventing a material of a metal wiring in said semiconductor device from being diffused into a silicon layer under said metal wiring, the method including the steps of: exposing the surface of said silicon layer to oxygen plasma, to prevent a silicide from being formed at the interface between said silicon layer and diffusion barrier metal layer; forming a first diffusion barrier metal layer on said silicon layer; implanting oxygen ions into said first diffusion barrier metal layer; and forming a second diffusion barrier metal layer on said first diffusion barrier metal layer.

BRIEF DESCRIPTION OF THE ATTACHED DRAWINGS

Other objects and aspects of the invention will become apparent from the following description of embodiments with reference to the accompanying drawings, in which:

FIGS. 1A to 1F are cross-sectional views showing processes for forming a diffusion barrier metal layer in accordance with an embodiment of the present invention.

DETAILED DESCRIPTION OF THE INVENTION

A preferred embodiment of the present invention will be described below referring to the accompanying drawings.

FIGS. 1A to 1F are cross-sectional views showing processes for forming a ruthenium oxide layer as a diffusion barrier metal layer.

Figure 1A:
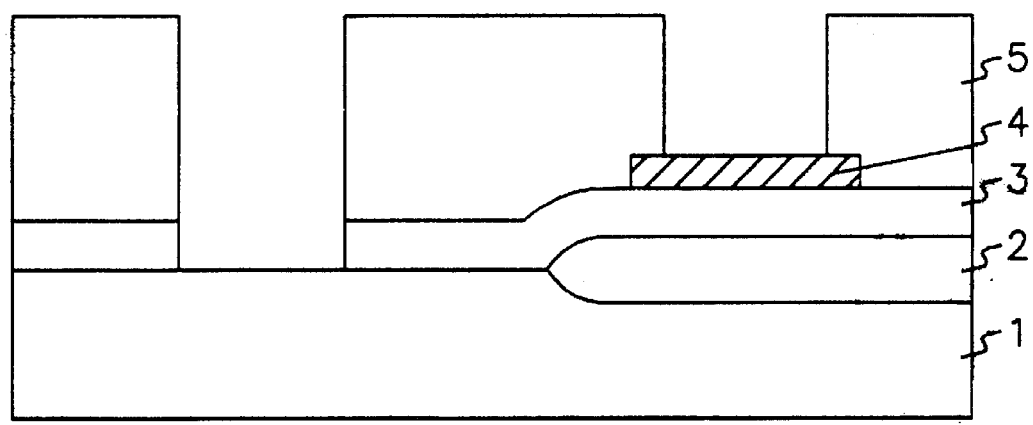

As shown in FIG. 1A, an insulating layer 3 is formed on a silicon substrate 1 and a field oxide layer 2, and a conducting layer 4 is formed on the field oxide layer 2. Then, an insulating layer 5 is formed on the overall surface of substrate 1, and the insulating layers 3 and 5 are selectively removed to form a contact hole, thereby exposing a predetermined portion of the silicon substrate 1 and the conducting layer 4.

Figure 1B:
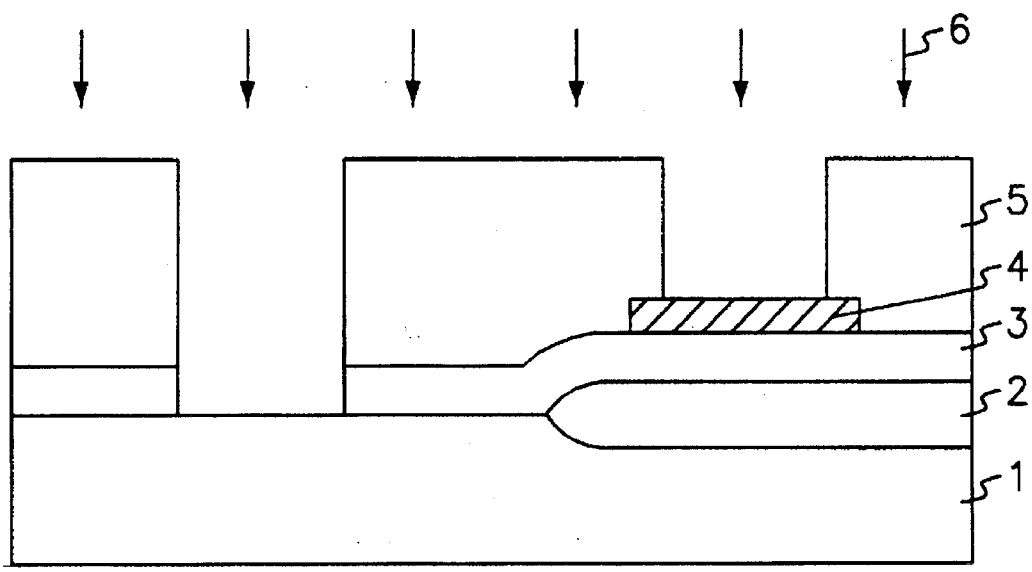

As shown in Fig. 1B, the overall surface of the substrate 1 is exposed to $O_2$ plasma 6. Here, the $O_2$ plasma 6 adheres to the overall surface of the substrate 1 on which the conducting layer 4 and the insulating layer 5 are formed. The $O_2$ plasma is formed at a low power of below 50W, and at a gas flow of 5 sccm to 50 sccm in plasma enhanced chemical vapor deposition (PECVD) chamber. As described above, by carrying out the $O_2$ plasma treatment, it is possible to prevent a silicide from being formed at the interface of ruthenium and silicon during the following heat treatment, and form a stable ruthenium oxide layer at a high temperature.

Figure 1C:
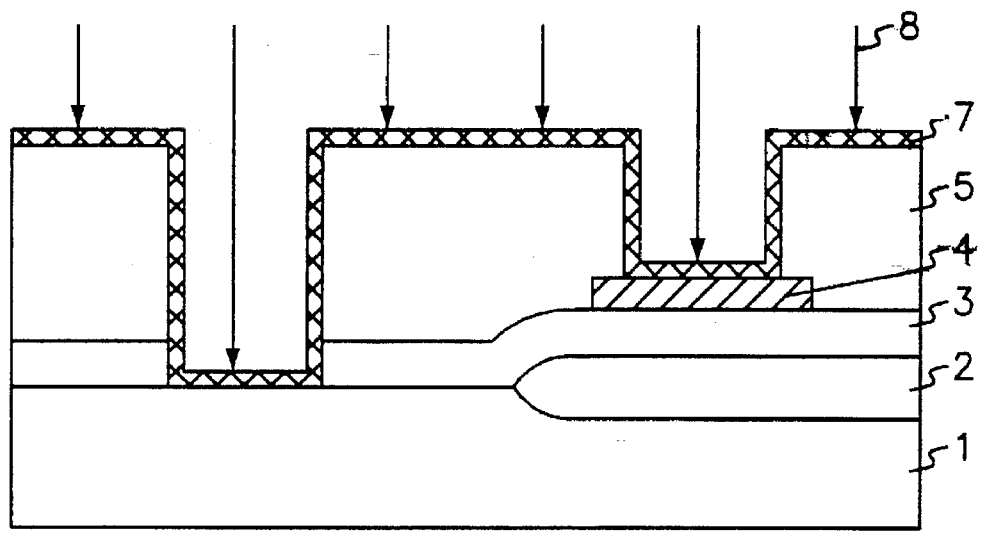

As shown in Fig. 1C, a first ruthenium layer 7 is formed to a thickness of 100 Å to 500 Å in PVD sputter camber on the overall surface of the substrate 1 on which the conducting layer 4 and the insulating layer 5 are formed. Then, $O_2$ is implanted into the overall surface of the first ruthenium layer 7. Here, $O_2$ implantation is carried out, considering the projection range Rp according to the thickness of the first ruthenium layer 7. For example, if the thickness of the first ruthenium layer is 200 Å, $O_2$ is implanted at a dose of $10^{15}$–$10^{19}$ ions/cm² and at an energy level of 50 keV.

Figure 1D:
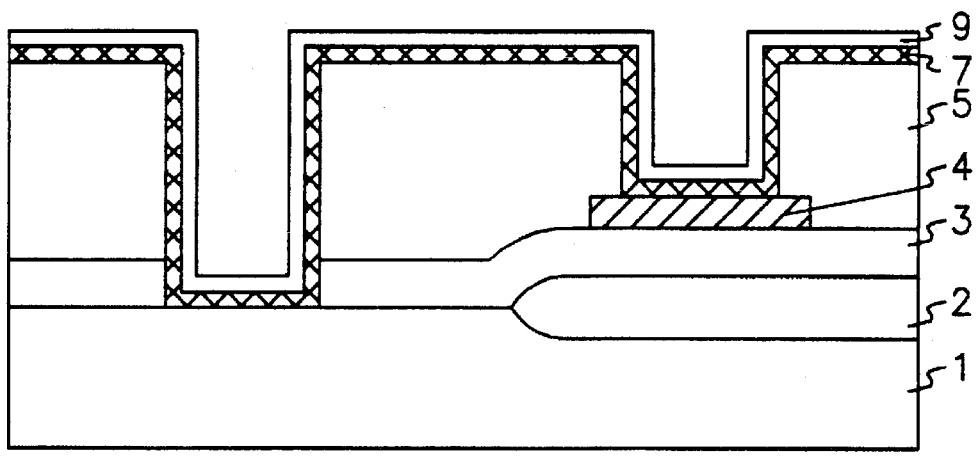
Figure 1E:
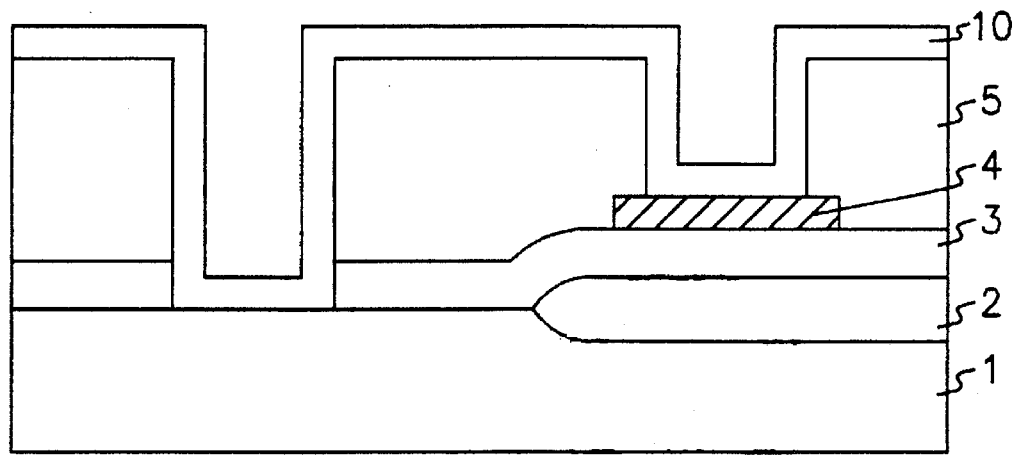
Figure 1F:
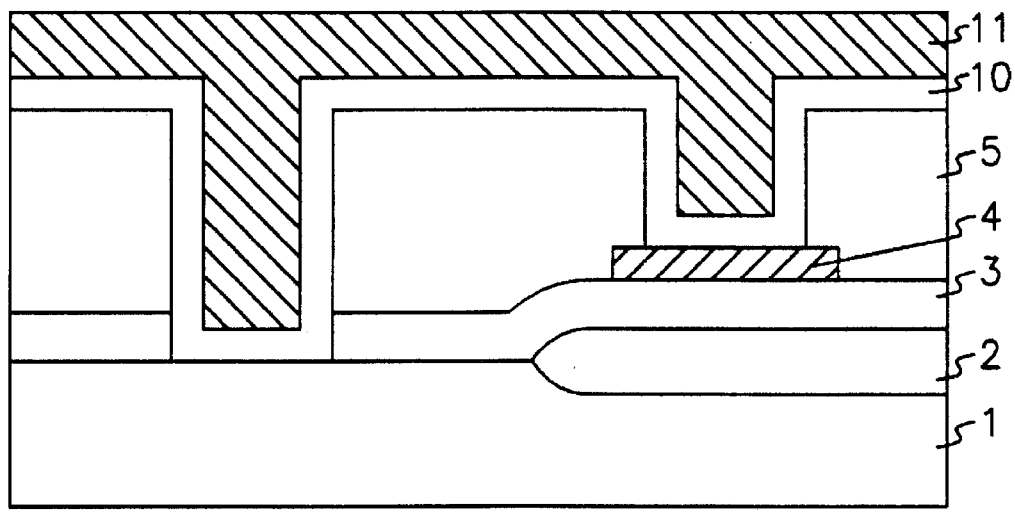

As shown in FIG. 1D, a second ruthenium layer 9 is formed under the same condition as that for the first ruthenium layer 7. Then, the substrate 1, on which the first and second ruthenium layers 7 and 9 are formed, is heat-treated in a tube in which argon and oxygen, or nitrogen and oxygen are mixed for one to five hours. By doing so, as shown in FIG. 1E, an ultimate ruthenium oxide layer 10 is formed. Here, the flow of argon/oxygen or nitrogen/oxygen introduced into the tube is approximately 100 sccm/10 sccm to 2000 sccm/300 sccm, and the temperature in the tube is approximately 400° C. to 700° C. As described above, $O_2$ is implanted into between the first and second ruthenium layers and a heat treatment is carried out in the tube, so that the stable ruthenium oxide layer can be formed. FIG. 1F is a cross-sectional view showing a device in which a metal wiring 11 is formed using ruthenium oxide layer 10 as a diffusion barrier. The metal wiring 11 is formed of aluminum, tungsten or copper.

According to the present invention described above, it is possible to prevent the silicide from being formed at the interface between the ruthenium layer and silicon layer. Thus, the stable ruthenium oxide layer can be obtained. By using the stable ruthenium oxide layer as a diffusion barrier, it is able to prevent the substance of the metal wiring from being diffused, and form a metal plug having low resistance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a diffusion barrier metal layer in a semiconductor device, for preventing a material of a metal wiring in said semiconductor device from being diffused into a silicon layer under said metal wiring, said method comprising the steps of:

exposing the surface of said silicon layer to oxygen plasma, to prevent a silicide from being formed at the interface between said silicon layer and diffusion barrier metal layer;

forming a first diffusion barrier metal layer on said silicon layer;

implanting oxygen ions into said first diffusion barrier metal layer; and forming a second diffusion barrier metal layer on said first diffusion barrier metal layer, wherein said first and second diffusion barder metal layers are ruthenium layers.

2. The method in accordance with claim 1, wherein said $O_2$ plasma is formed at a low power of below 50 W and a gas flow of 5 sccm to 50 sccm in PECVD chamber.

3. The method in accordance with claim 2, wherein the density of said oxygen ions is a dose of $10^{15}$–$10^{19}$ions/cm$^2$.

4. The method in accordance with claim 2, wherein said first diffusion barrier metal layer is formed at a thickness of 100 Å to 500 Å.

5. The method in accordance with claim 1, the step of forming said second diffusion barrier metal layer further comprises the step of oxidizing said first and second diffusion barrier metal layers.

6. The method in accordance with claim 5, wherein said oxidizing step is heat treatment carried out in a tube, in which argon and oxygen, or nitrogen and oxygen are mixed, for one to five hours.

7. The method in accordance with claim 6, wherein the flow of said argon/oxygen or nitrogen/oxygen in said tube is approximately 100 sccm/10 sccm to 2000 sccm/300 sccm.

8. The method in accordance with claim 7, wherein the temperature in said tube is approximately 400° C. to 700° C.

* * * * *